(12) United States Patent
Fan et al.

(10) Patent No.: US 11,705,450 B2
(45) Date of Patent: Jul. 18, 2023

(54) SEMICONDUCTOR STRUCTURES AND METHODS OF FORMING THE SAME

(71) Applicant: Taiwan Semiconductor Manufacturing Company Limited, Hsinchu (TW)

(72) Inventors: Ni-Wan Fan, Miao-Li County (TW); Jung-Chan Yang, Taoyuan County (TW); Hsiang-Jen Tseng, Hsinchu (TW); Tommy Hu, Hsinchu (TW); Chi-Yu Lu, New Taipei (TW); Wei-Ling Chang, Hsinchu (TW)

(73) Assignee: Taiwan Semiconductor Manufacturing Company Limited, Hsinchu (TW)

( * ) Notice: Subject to any disclaimer, the term of this patent is extended or adjusted under 35 U.S.C. 154(b) by 127 days.

(21) Appl. No.: 17/224,220

(22) Filed: Apr. 7, 2021

(65) Prior Publication Data
US 2021/0225838 A1 Jul. 22, 2021

Related U.S. Application Data

(63) Continuation of application No. 16/562,650, filed on Sep. 6, 2019, now Pat. No. 10,985,160, which is a
(Continued)

(51) Int. Cl.
*H01L 27/088* (2006.01)
*H01L 21/8234* (2006.01)
(Continued)

(52) U.S. Cl.
CPC ...... *H01L 27/088* (2013.01); *H01L 21/76895* (2013.01); *H01L 21/823412* (2013.01);
(Continued)

(58) Field of Classification Search
CPC ............ H01L 27/088; H01L 21/76895; H01L 21/823412; H01L 21/823418;
(Continued)

(56) References Cited

U.S. PATENT DOCUMENTS 5,998,821 A 12/1999 Hieda et al.
6,294,464 B1 9/2001 Trivedi
(Continued)

FOREIGN PATENT DOCUMENTS

CN 112234100 A * 1/2021 ........... H01L 21/046

OTHER PUBLICATIONS

Taiwan Office Action; Application No. 106135554; dated Apr. 330, 2020.
(Continued)

*Primary Examiner* — Edward Chin
(74) *Attorney, Agent, or Firm* — Jones Day

(57) ABSTRACT

Semiconductor structures and methods for forming a semiconductor structure are provided. The method includes forming a first active semiconductor region disposed in a first vertical level of the semiconductor structure, forming a second active semiconductor region disposed in the first vertical level, where the second active semiconductor region is separated from the first active semiconductor region by a distance in a first direction, forming a first conductive structure disposed in a second vertical level that is adjacent to the first vertical level. The first conductive structure extends along the first direction and electrically couples the first active semiconductor region to the second active semiconductor region.

20 Claims, 10 Drawing Sheets

Related U.S. Application Data continuation of application No. 15/353,817, filed on Nov. 17, 2016, now Pat. No. 10,446,546.

(51) Int. Cl.
 *H01L 21/768* (2006.01)
 *H01L 23/485* (2006.01)
 *H01L 27/02* (2006.01)
 *H01L 27/092* (2006.01)

(52) U.S. Cl.
 CPC .... *H01L 21/823418* (2013.01); *H01L 23/485* (2013.01); *H01L 21/823475* (2013.01); *H01L 27/0207* (2013.01); *H01L 27/092* (2013.01)

(58) Field of Classification Search
 CPC ........... H01L 23/485; H01L 21/823475; H01L 27/0207; H01L 27/092; H01L 23/5283
 See application file for complete search history.

(56) References Cited

U.S. PATENT DOCUMENTS

| | | |
|---|---|---|
| 6,411,545 B1 | 6/2002 | Caywood |
| 7,285,477 B1 | 10/2007 | Bernstein et al. |
| 7,851,923 B2 | 12/2010 | Erturk et al. |
| 7,968,409 B2 | 6/2011 | Seliskar |
| 8,394,700 B2 | 3/2013 | Scott et al. |
| 9,620,594 B2 | 4/2017 | Chen et al. |
| 9,673,275 B2 | 6/2017 | Kim et al. |
| 2009/0159946 A1 | 6/2009 | Huang et al. |
| 2009/0290417 A1 | 11/2009 | Park et al. |
| 2012/0289003 A1* | 11/2012 | Hirler ............... H01L 29/66295 438/156 |
| 2014/0001515 A1* | 1/2014 | Kudymov ............ H01L 27/088 257/192 |
| 2014/0008757 A1 | 1/2014 | Ramachandran et al. |
| 2015/0054043 A1 | 2/2015 | Tan et al. |
| 2015/0102413 A1* | 4/2015 | Azmat ................ H01L 23/5384 257/365 |
| 2016/0093628 A1 | 3/2016 | Chen et al. |
| 2016/0095221 A1 | 3/2016 | Ramachandran et al. |
| 2016/0204158 A1 | 7/2016 | Hsu et al. |
| 2016/0329276 A1 | 11/2016 | Lin et al. |

OTHER PUBLICATIONS

Chinese Office Action; Application No. 201710963604.X; dated Mar. 23, 2021.

* cited by examiner

SEMICONDUCTOR STRUCTURES AND METHODS OF FORMING THE SAME

CROSS-REFERENCE TO RELATED APPLICATIONS

This application is a continuation application of U.S. patent application Ser. No. 16/562,650, filed Sep. 6, 2019, which is a continuation application of U.S. patent application Ser. No. 15/353,817, filed Nov. 17, 2016, entitled, "Semiconductor Structures and Methods of Forming the Same," both of which are incorporated herein by reference in their entireties.

BACKGROUND

Integrated circuits (ICs) are often designed with devices (e.g., transistors, resistors, capacitors, etc.) connected by conductive traces, such as metal lines and polysilicon lines, to form circuits. The devices in ICs are formed by a photolithographic process that includes use of photoresists, photolithographic masks, specialized light sources, and various etchants.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1A:
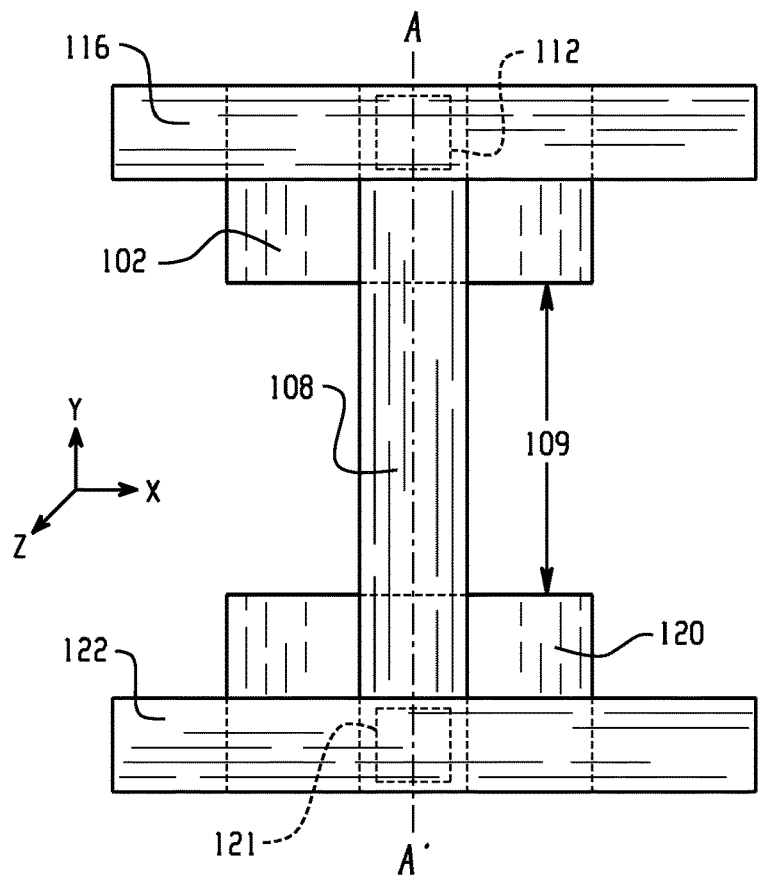
FIG. 1A illustrates a top-down view of a semiconductor structure, in accordance with some embodiments.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

The present disclosure relates to semiconductor structures and methods of forming semiconductor structures. In some embodiments described herein, conductive structures (e.g., metal lines, etc.) are utilized to form electrical connections between active semiconductor regions of a semiconductor structure. For instance, in some embodiments, a conductive structure is used to form an electrical connection between a first active semiconductor region formed in a substrate (e.g., a source or drain region of a first transistor) and a second active semiconductor region formed in the substrate (e.g., a source or drain region of a second transistor). In such embodiments, the conductive structure is formed directly over (e.g., in direct contact with) the first and second active semiconductor regions, thus enabling these active regions to be electrically connected with a minimal amount of vertical routing.

As described in further detail below, the techniques of the present disclosure are in contrast to other techniques that require a greater degree of vertical routing to achieve the same electrical connections. The techniques of the present disclosure thus utilize a lower amount of routing space and a lower amount of routing material (e.g., metal material, etc.) as compared to the other techniques. These advantages and others of the present disclosure are described in detail below.

Figure 1B:
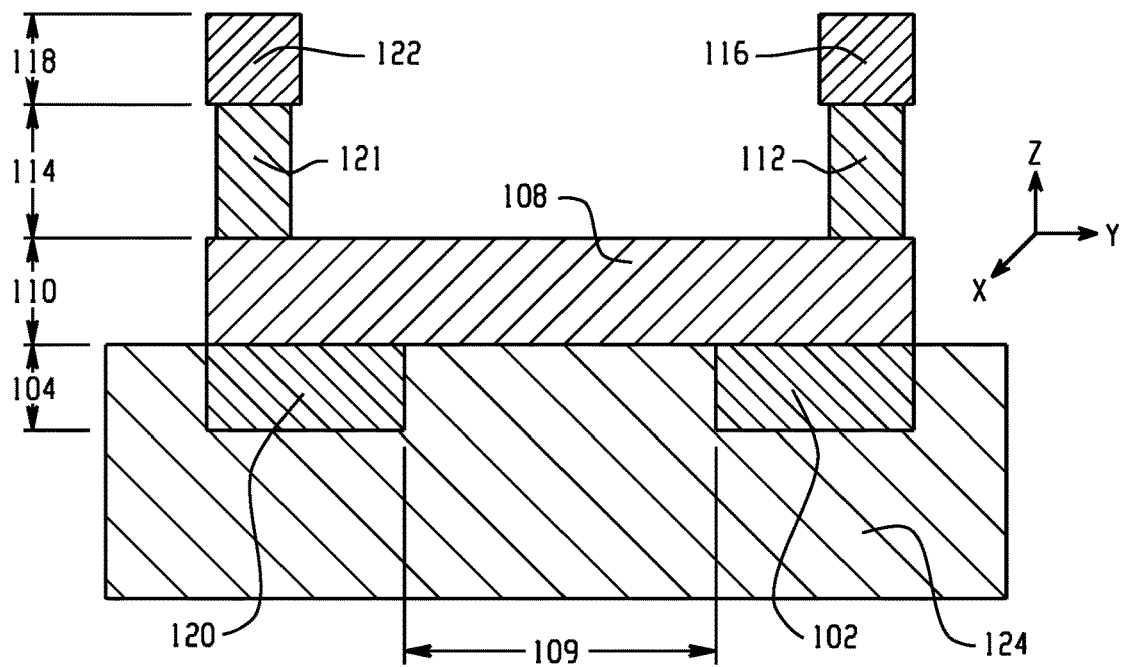
FIG. 1B illustrates a cross-sectional view of the semiconductor structure of FIG. 1A, in accordance with some embodiments.
Figure 1C:
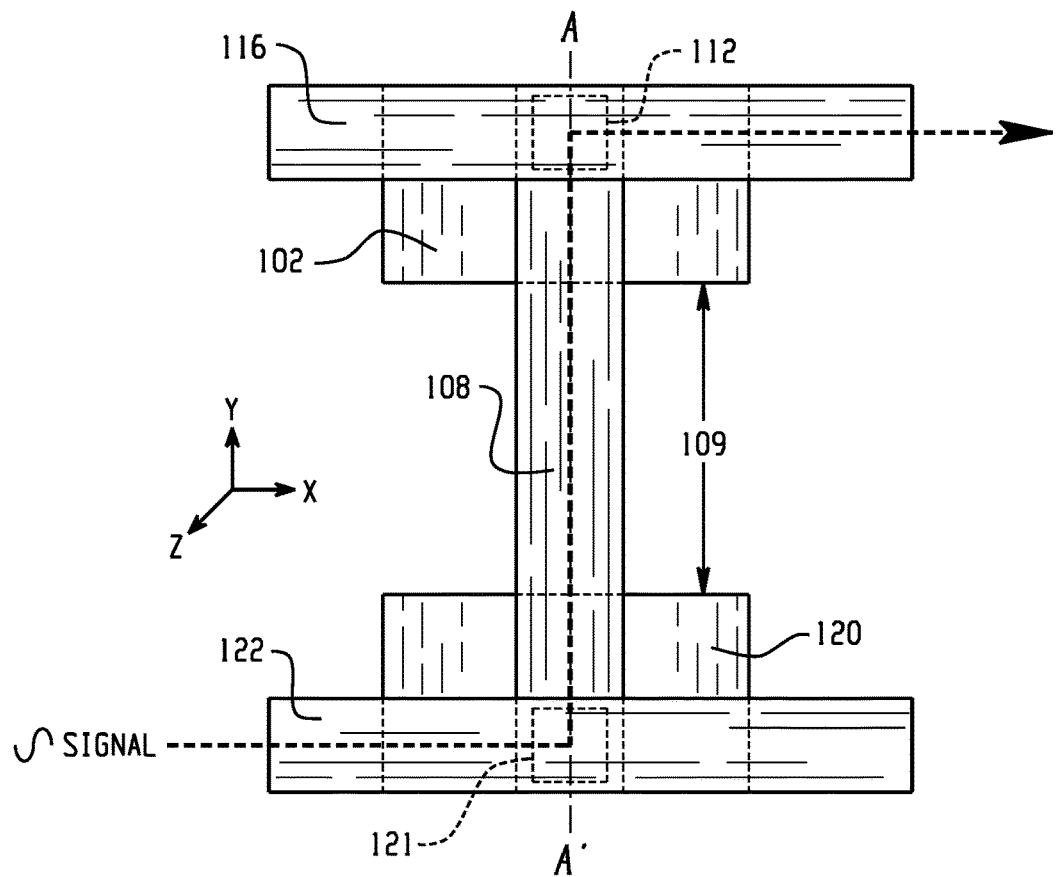
FIGS. 1C and 1D illustrate a signal path of the semiconductor structure of FIGS. 1A and 1B, in accordance with some embodiments.
Figure 1D:
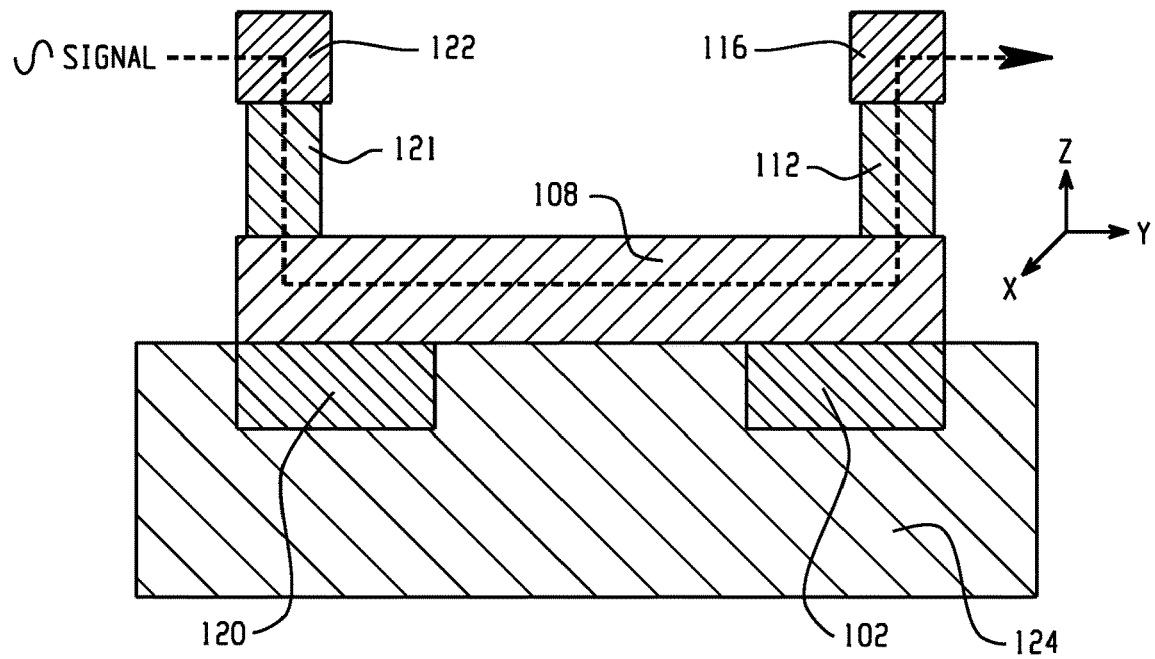

FIG. 1A illustrates a top-down view of a semiconductor structure, and FIG. 1B illustrates a cross-sectional view of the semiconductor structure along a cut-line A-A' shown in FIG. 1A. The semiconductor structure includes a first active semiconductor region 102 disposed in a first vertical level 104. In some embodiments, the first active semiconductor region 102, which may also be referred to as an oxide definition (OD) region or an active device region, comprises a source region or a drain region of a transistor (e.g., a source or drain diffusion region). The first active semiconductor region 102 is formed in a substrate 124 (e.g., a silicon substrate, another semiconductor substrate, etc.), in some embodiments. Further, in some embodiments, the first active semiconductor region 102 comprises a doped semiconductor region, such as a portion of the substrate 124 that has been doped p-type or n-type.

The semiconductor structure of FIGS. 1A and 1B further includes a second active semiconductor region 120 disposed in the first vertical level 104. The second active semiconductor region 120 is separated from the first active semiconductor region 102 by a distance 109 in the y-direction. Like the first active semiconductor region 102, the second active semiconductor region 120 comprises a source region or a drain region of a transistor, in some embodiments. Specifically, in some embodiments, the first active semiconductor region 102 comprises a source or drain region of a first transistor, and the second active semiconductor region 120 comprises a source or drain region of a second transistor. In some embodiments, the second active semiconductor region 120 comprises a doped semiconductor region, such as a portion of the substrate 124 that has been doped p-type or n-type.

In the example of FIGS. 1A and 1B, the first and second active semiconductor regions 102, 120 are not in contact (e.g., direct contact) with each other. Thus, to enable the first and second active semiconductor regions 102, 120 to communicate (e.g., to pass a signal, voltage, or current between the regions 102, 120, etc.), an electrical connection is made between these regions 102, 120. In some embodiments, a first conductive structure 108 is utilized to form this electrical connection. As shown in FIGS. 1A and 1B, the first conductive structure 108 extends in the y-direction between the first and second active semiconductor regions 102, 120, thus forming an electrical connection between these regions 102, 120.

In some embodiments, the first and second active semiconductor regions 102, 120 are formed as part of a front-end-of-line (FEOL) process, and the first conductive structure 108 is a metal line formed as part of a middle-of-line (MEOL) process. Semiconductor fabrication processes are often considered to include a FEOL portion, a MEOL portion, and a back-end-of-line (BEOL) portion. FEOL is the first portion of a semiconductor fabrication process (e.g., an IC fabrication process) whereby individual active devices are patterned on a semiconductor wafer, for example. FEOL processes include, in embodiments, selecting the type of semiconductor wafer to be used, chemical-mechanical planarization and cleaning of the wafer, shallow trench isolation (STI), well formation, gate module formation, and source and drain creation, among others. FEOL processes do not include the deposition of metal interconnect layers, in embodiments. MEOL processes occur after FEOL processes and include gate contact formation and under bump metallization (UBM) processes, among others, in embodiments. BEOL is the final portion of the semiconductor fabrication process, whereby individual devices (e.g., transistors, capacitors, resistors, etc.) are interconnected with vias and conductive traces, for example.

In some embodiments, the first conductive structure 108 is formed in a metal layer that is disposed directly above the active semiconductor regions 102, 120 (e.g., directly above OD regions, directly above active device regions, etc.). The metal layer disposed directly above the active semiconductor regions 102, 120 is sometimes referred to as a metal "MD" layer. In embodiments, the metal MD layer is a layer formed as part of an MEOL process.

The first conductive structure 108 is formed in a second vertical level 110 that is adjacent to the first vertical level 104 in which the first and second active semiconductor regions 102, 120 are formed. The first conductive structure 108 is formed above the active semiconductor regions 102, 120 in the embodiment of FIG. 1B. In other embodiments, however, the first conductive structure 108 is formed in a vertical level that is adjacent to the first vertical level 104 and below the first vertical level 104. In some embodiments, the first conductive structure 108 is in contact (e.g., direct contact) with the first active semiconductor region 102 and the second active semiconductor region 120.

The semiconductor structure of FIGS. 1A and 1B further includes a first via 112 in contact with a portion of the first conductive structure 108 that is disposed above the first active semiconductor region 102. As shown in FIG. 1B, the first via 112 is disposed in a third vertical level 114 that is above the second vertical level 110. A second conductive structure 116 is in contact with the first via 112 and disposed in a fourth vertical level 118 that is above the third vertical level 114. A second via 121 is in contact with a portion of the first conductive structure 108 that is disposed above the second active semiconductor region 120. As shown in FIG. 1B, the second via 121 is disposed in the third vertical level 114. A third conductive structure 122 is in contact with the second via 121 and disposed in the fourth vertical level 118.

In the embodiment of FIGS. 1A and 1B, the second and third conductive structures 116, 118 extend in the x-direction. The direction in which the second and third conductive structures 116, 118 extend is perpendicular to the direction in which the first conductive structure 108 extends. Thus, in the embodiment of FIGS. 1A-1E, the first conductive structure 108 extends in the y-direction, and the second and third conductive structures 116, 122 extend in the x-direction. In other embodiments, the first conductive structure 108 extends in the x-direction, and the second and third conductive structures 116, 122 extend in the y-direction.

In some embodiments, the second and third conductive structures 116, 122 are formed as part of a MEOL or BEOL process. In some embodiments, the second and third conductive structures 116, 122 are formed within a metal 0 (M0) layer that is disposed above the first and second vias 112, 121. As noted above, in some embodiments, the first conductive structure 108 is formed within the metal "MD" layer that is disposed above the active semiconductor regions 102, 120. In some embodiments, each of the MD and M0 layers can include metal lines extending in one direction. Further, under these embodiments, the direction of metal lines formed in the MD layer is perpendicular to the direction of metal lines formed in the M0 layer. Thus, in the embodiment of FIGS. 1A and 1B, the first conductive structure 108 formed within the MD layer extends in the y-direction, and the second and third conductive structures 116, 122 formed within the M0 layer extend in the x-direction, as described above.

In some embodiments, the second and third conductive structures 116, 122 comprise metal contacts for providing a signal (e.g., a voltage signal, a current signal, another type of signal, etc.) to the semiconductor structure and receiving a signal from the semiconductor structure. To illustrate this use of the second and third conductive structures 116, 122, reference is made to FIGS. 1C and 1D. These figures depict a signal being input to the semiconductor structure via the third conductive structure 122. The signal propagates through the second via 121, the first conductive structure 108, and the first via 112, as shown in the figure. The signal is received at the second conductive structure 116. In some embodiments, because the first conductive structure 108 is electrically coupled to the first and second active semiconductor regions 102, 120 (as described above), the signal also propagates to these regions 102, 120 of the semiconductor structure.

The use of the first conductive structure 108 to provide an electrical connection between the first and second active semiconductor regions 102, 120 differs from other techniques. In the other techniques, a structure having a larger amount of vertical routing is utilized to provide an electrical connection between the regions 102, 120. Specifically, in the other techniques, a metal line formed in a layer (e.g., the MD layer) directly above the regions 102, 120 does not extend from the first active semiconductor region 102 to the second active semiconductor region 120, and thus does not provide electrical coupling between these regions 102, 120. In some of the other techniques, a metal line formed in the layer directly above the regions 102, 120 is "cut." Thus, a first portion of the metal line is in contact with the first active semiconductor region 102, and a second portion of the metal line is in contact with the second active semiconductor region 120, but due to the cutting, these portions of the metal line are not in direct electrical connection and thus do not provide an electrical connection between the regions 102, 120. Accordingly, in the other techniques, to provide an electrical connection between the first and second active semiconductor regions 102, 120, vertical routing is utilized.

In some embodiments of the other techniques, a metal line formed in a metal 1 (M1) metal layer extends between the regions 102, 120. The M1 metal layer is formed above the aforementioned M0 metal layer, relative to the substrate. The M1 metal layer is not adjacent to the vertical level 104 including the regions 102, 120 and is instead separated from the vertical level 104 by several layers (e.g., the M1 metal layer is separated from the vertical level 104 by the MD and M0 metal layers described above, in some embodiments). Thus, to enable the metal line formed in the M1 layer to electrically couple the regions 102, 120 together, a vertical routing structure is utilized to connect the regions 102, 120 to the metal line formed in the M1 layer. The vertical routing structure includes, in some embodiments, multiple vias and/or multiple conductive structures. These techniques can utilize a relatively large amount of routing material (e.g., metal material, etc.) and a relatively large amount of routing space. The relatively large amount of routing material can result in unwanted capacitances.

In contrast to the other techniques described above, embodiments of the present disclosure utilize the conductive structure 108 that is not cut, thus enabling the conductive structure 108 to extend between the regions 102, 120 and provide an electrical connection between these regions 102, 120. In embodiments of the present disclosure, the conductive structure 108 is formed directly over (e.g., in direct contact with) the active semiconductor regions 102, 120, thus enabling these regions 102, 120 to be electrically connected with a minimal amount of vertical routing. Embodiments of the present disclosure thus utilize a lower amount of routing space and a lower amount of routing material as compared to the other techniques. Other advantages provided by embodiments of the present disclosure are explained below.

As noted above, in some embodiments of the present disclosure, the first conductive structure 108 is formed within a metal "MD" layer that is disposed directly above the active semiconductor regions 102, 120. The MD layer is formed as part of an MEOL process, in some embodiments, and is not formed as part of a BEOL process. By contrast, in the other techniques described above, electrical coupling between the regions 102, 120 is accomplished using a metal line in the M1 layer, which is formed as part of a BEOL process. It is thus noted that embodiments of the present disclosure differ from these other embodiments, because the embodiments of the present disclosure achieve electrical coupling between the regions 102, 120 (i) without the use of the M1 metal layer, and (ii) without the use of a BEOL process.

Figure 1G:
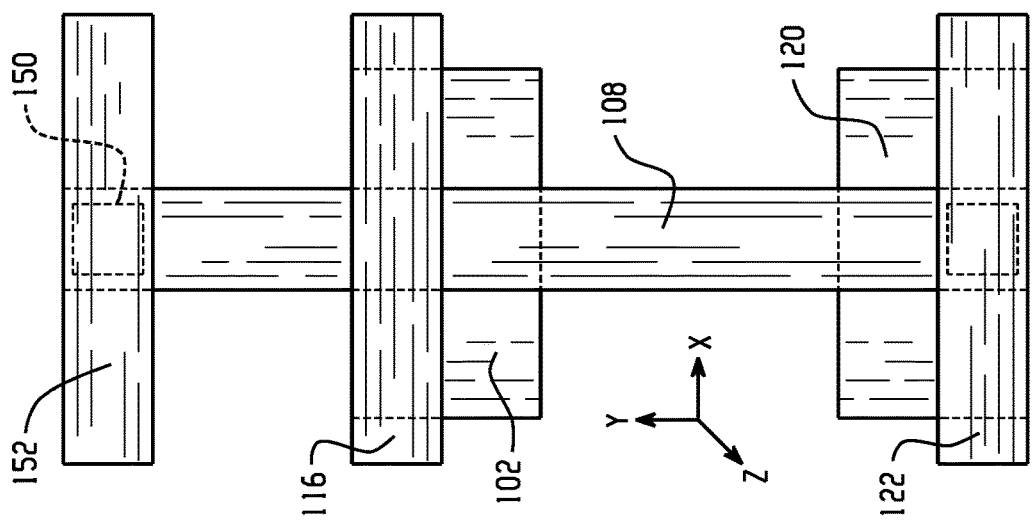
FIGS. 1E, 1F, and 1G illustrate top-down views of semiconductor structures, in accordance with some embodiments.
Figure 1F:
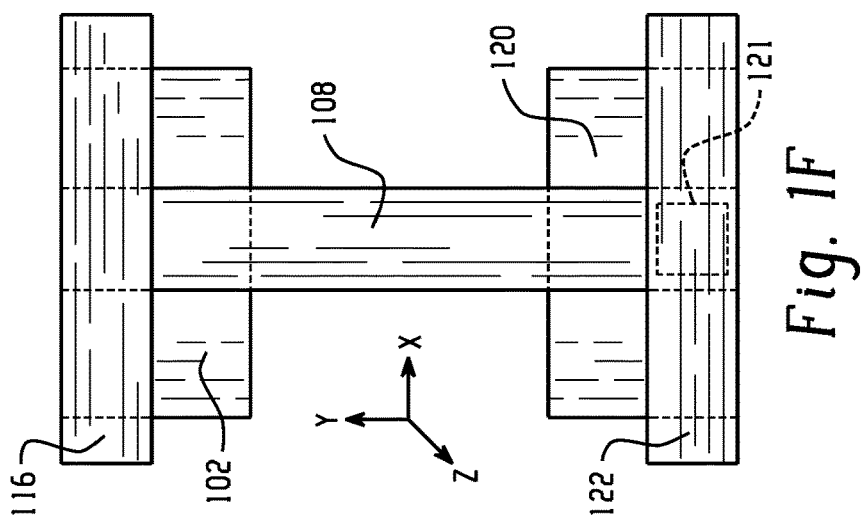

Although the embodiment of FIGS. 1A-1D includes the active semiconductor regions 102, 120 disposed within the substrate 124 (e.g., disposed within a silicon substrate), in other embodiments of the present disclosure, the regions 102, 120 are formed in a semiconductor layer that is above the substrate 124. Further, it is noted that the techniques of the present disclosure are not limited to the particular structures shown in FIGS. 1A-1D and that the techniques described herein can be utilized in a wide variety of other structures. Examples of such other structures are shown in FIGS. 1E-1G.

Figure 1E:
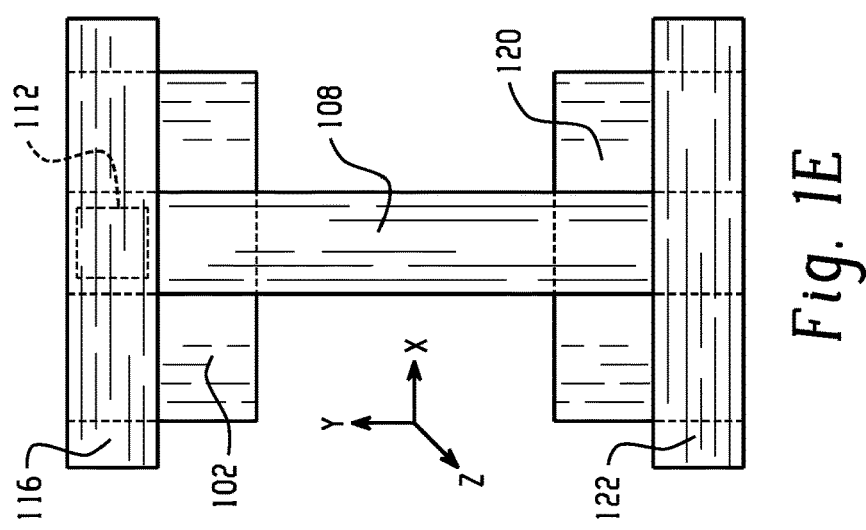

The embodiment of FIG. 1E is similar to the embodiment of FIGS. 1A-1D but does not include the second via 121. Likewise, the embodiment of FIG. 1F is similar to the embodiment of FIGS. 1A-1D but does not include the first via 112. The embodiments of FIGS. 1E and 1F reflect the fact that in some instances, the first via 112 or the second via 121 may be eliminated to further reduce an amount of routing material. It is noted that the removal of the first via 112 or the second via 121 does not affect the electrical connection between the regions 102, 120 because these regions 102, 120 are electrically connected via the first conductive structure 108. In the embodiment of FIG. 1G, the first conductive structure 108 is longer than it is in the embodiments of FIGS. 1A-1F. Further, in the embodiment of FIG. 1G, a via 150 and conductive structure 152 not included in the embodiments of FIGS. 1A-1F are utilized. The via 150 is disposed in the third vertical level 114, and the conductive structure 152 is disposed in the fourth vertical level 118. The embodiment of FIG. 1G provides a contact (e.g., formed via the via 150 and conductive structure 152) that is not disposed directly above either of the regions 102, 120. Additionally, it can be seen that the embodiment of FIG. 1G includes neither the first via 112 nor the second via 121 of FIGS. 1A-1D.

Figure 2A:
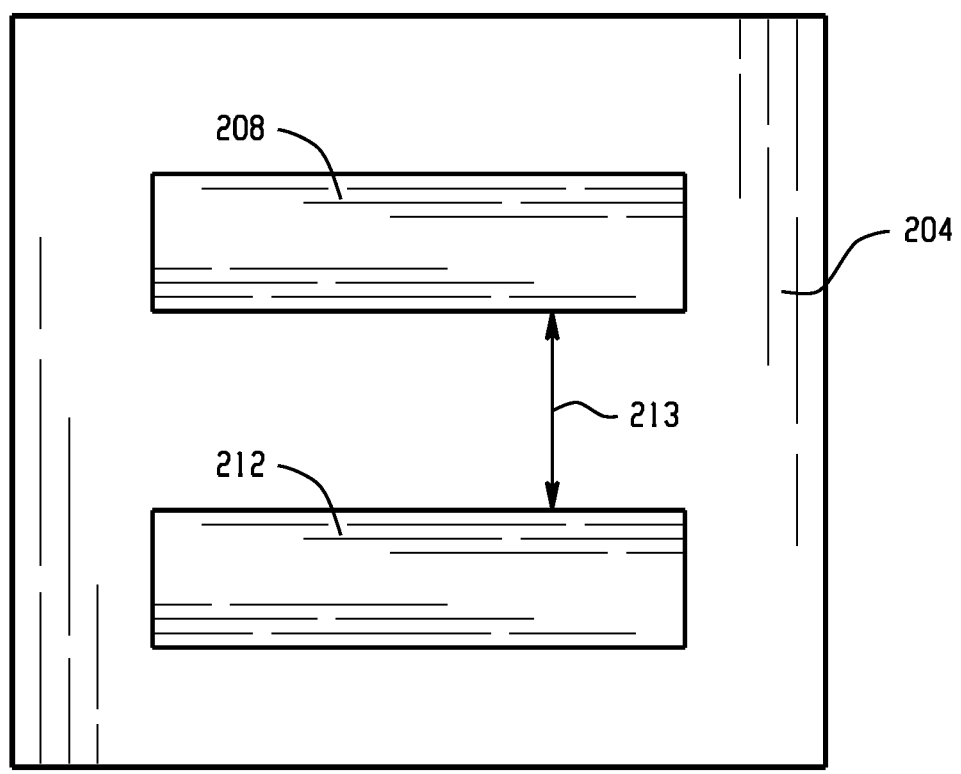
FIGS. 2A-2E illustrate examples in which a conductive structure is used to provide electrical coupling between transistors, in accordance with some embodiments.

In some embodiments, the techniques of the present disclosure are used to provide electrical coupling between transistors. To illustrate such embodiments, reference is made to FIG. 2A. This figure depicts a first active semiconductor region 208 and a second active semiconductor region 212 formed in a layer 204. In embodiments, the first active semiconductor region 208 is similar to or the same as the first active semiconductor region 102 of FIGS. 1A-1G, and the second active semiconductor region 212 is similar to or the same as the second active semiconductor region 120 of FIGS. 1A-1G. In embodiments, the layer 204 comprises a substrate or a portion thereof. In the embodiment of FIG. 2A, the first and second active semiconductor regions 208, 212 are parallel active semiconductor regions that extend in the x-direction, as shown in the figure.

Figure 2B:
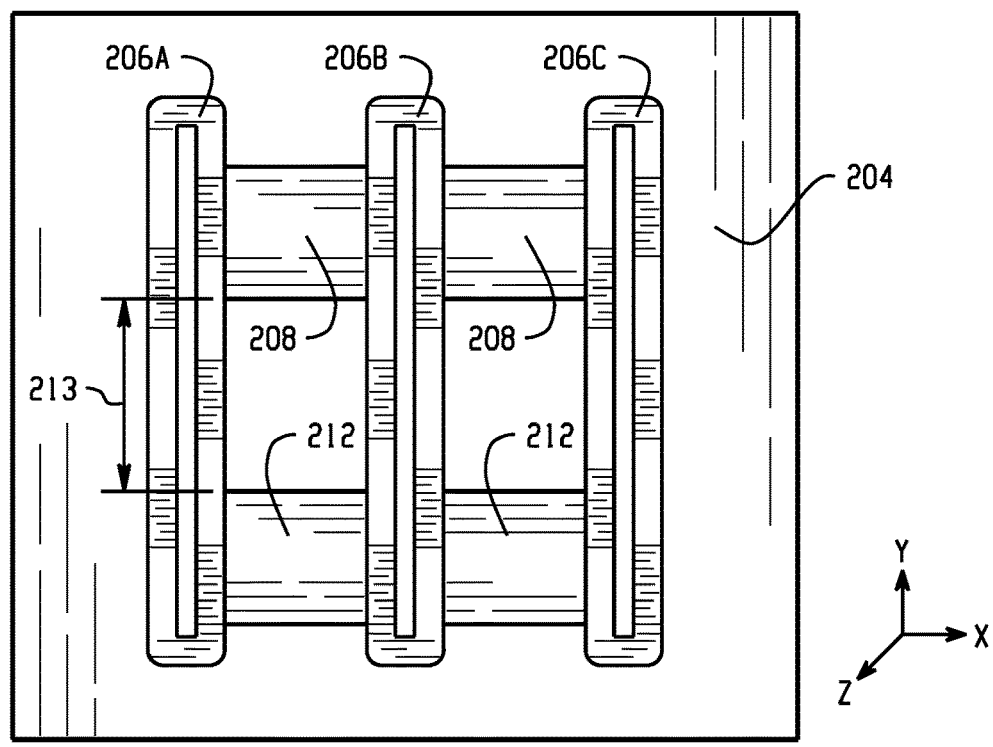

As shown in FIG. 2B, multiple gates 206A, 206B, 206C are formed over the layer 204, thus covering portions of the first and second active semiconductor regions 208, 212. In some embodiments, each of the gates 206A, 206B, 206C comprises a gate dielectric (e.g., a gate dielectric comprising an insulating material, such as a high-K material, etc.) and a polysilicon or metal structure formed over the gate dielectric. In some embodiments, a first source region and a first drain region of a first transistor are disposed in the first active semiconductor region 208 on opposite sides of the gate 206B. A channel region of the first transistor is disposed in the first active semiconductor region 208 under the gate 206B. Similarly, in some embodiments, a second source region and a second drain region of a second transistor are disposed in the second active semiconductor region 212 on opposite sides of the gate 206B. A channel region of the second transistor is disposed in the second active semiconductor region 212 under the gate 206B.

Figure 2C:
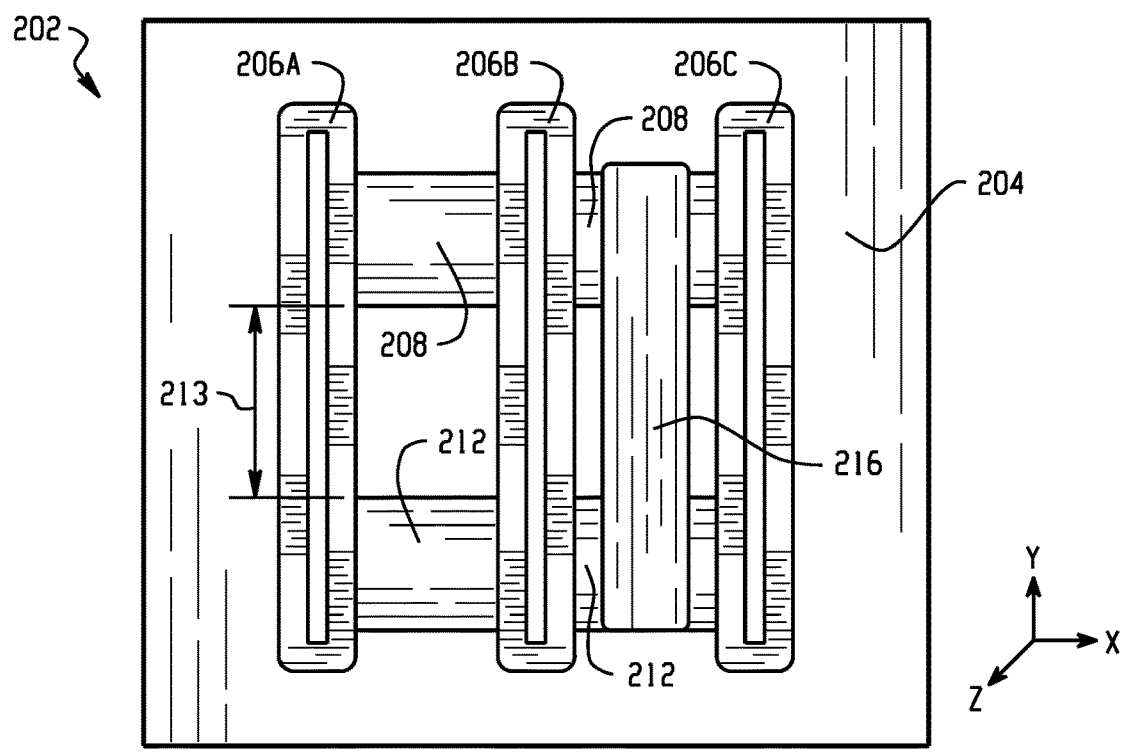

In the example of FIGS. 2A and 2B, the first and second active semiconductor regions 208, 212 are separated from each other by a distance 213 in the y-direction. In some embodiments, to electrically couple the first active semiconductor region 208 to the second active semiconductor region 212, the conductive structure 216 illustrated in FIG. 2C is utilized. The conductive structure 216 is the same as or similar to the conductive structure 108 described above with reference to FIGS. 1A-1G. Thus, in some embodiments, the conductive structure 216 extends in the y-direction and is formed directly over (e.g., in direct contact with) the active semiconductor regions 208, 212. The conductive structure 216 is disposed in a vertical level that is adjacent to a vertical level in which the active semiconductor regions 208, 212 are disposed, thus providing an electrical connection between the regions 208, 212 with a minimal amount of vertical routing.

By electrically coupling the first active semiconductor region 208 to the second active semiconductor region 212, in some embodiments, the conductive structure 216 electrically couples the drain or source region of the first transistor to the drain or source region of the second transistor. Specifically, as noted above, first drain and first source regions of the first transistor are formed in the first active semiconductor region 208 on opposite sides of the gate 206B, and second drain and second source regions of the second transistor are formed in the second active semiconductor region 212 on opposite sides of the gate 206B. Accordingly, by forming the conductive structure 216 as shown in FIG. 2C, the conductive structure 216 provides electrical coupling between the source or drain region of the first transistor and the source or drain region of the second transistor, in some embodiments.

Figure 2D:
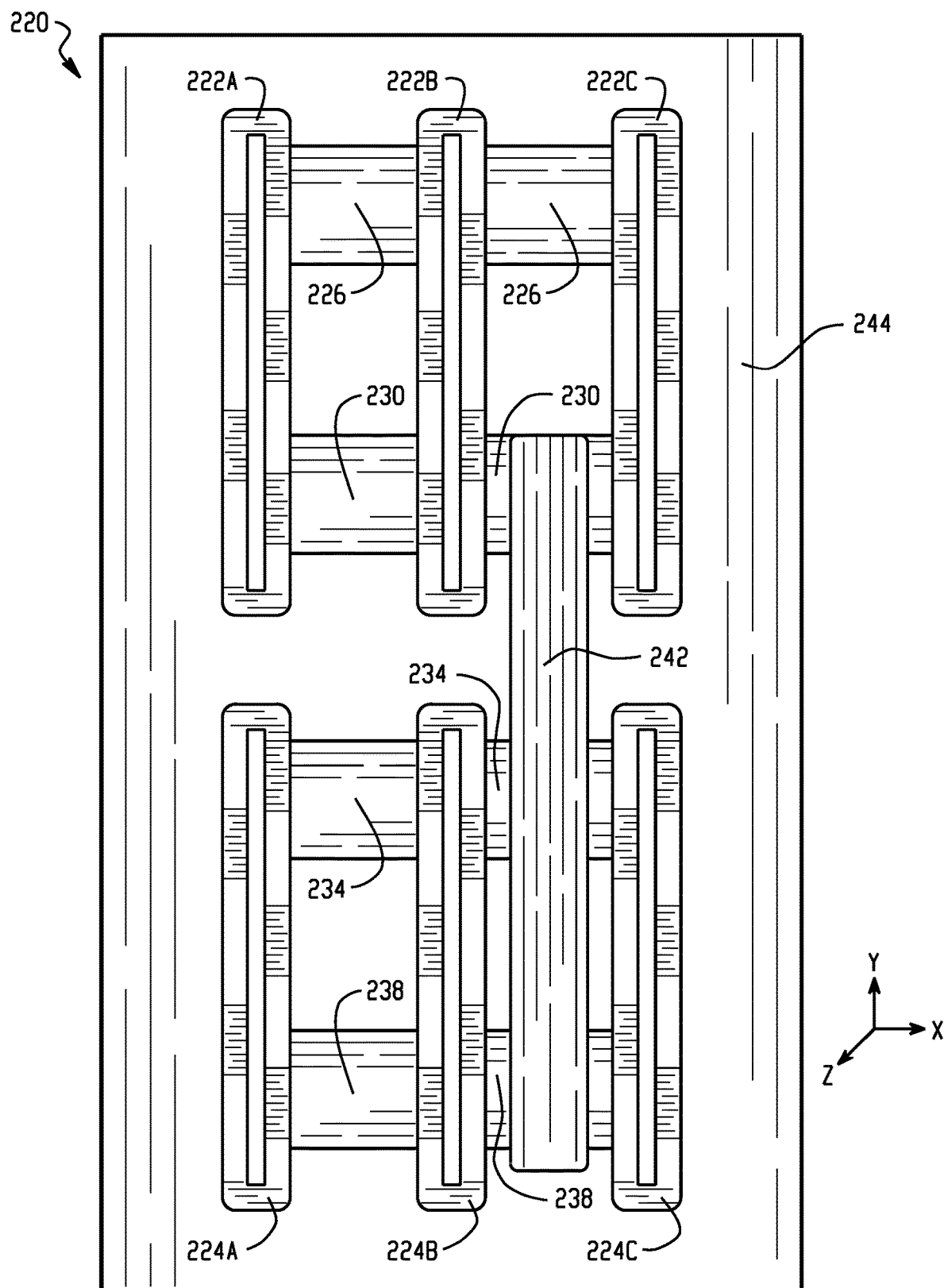
Figure 2E:
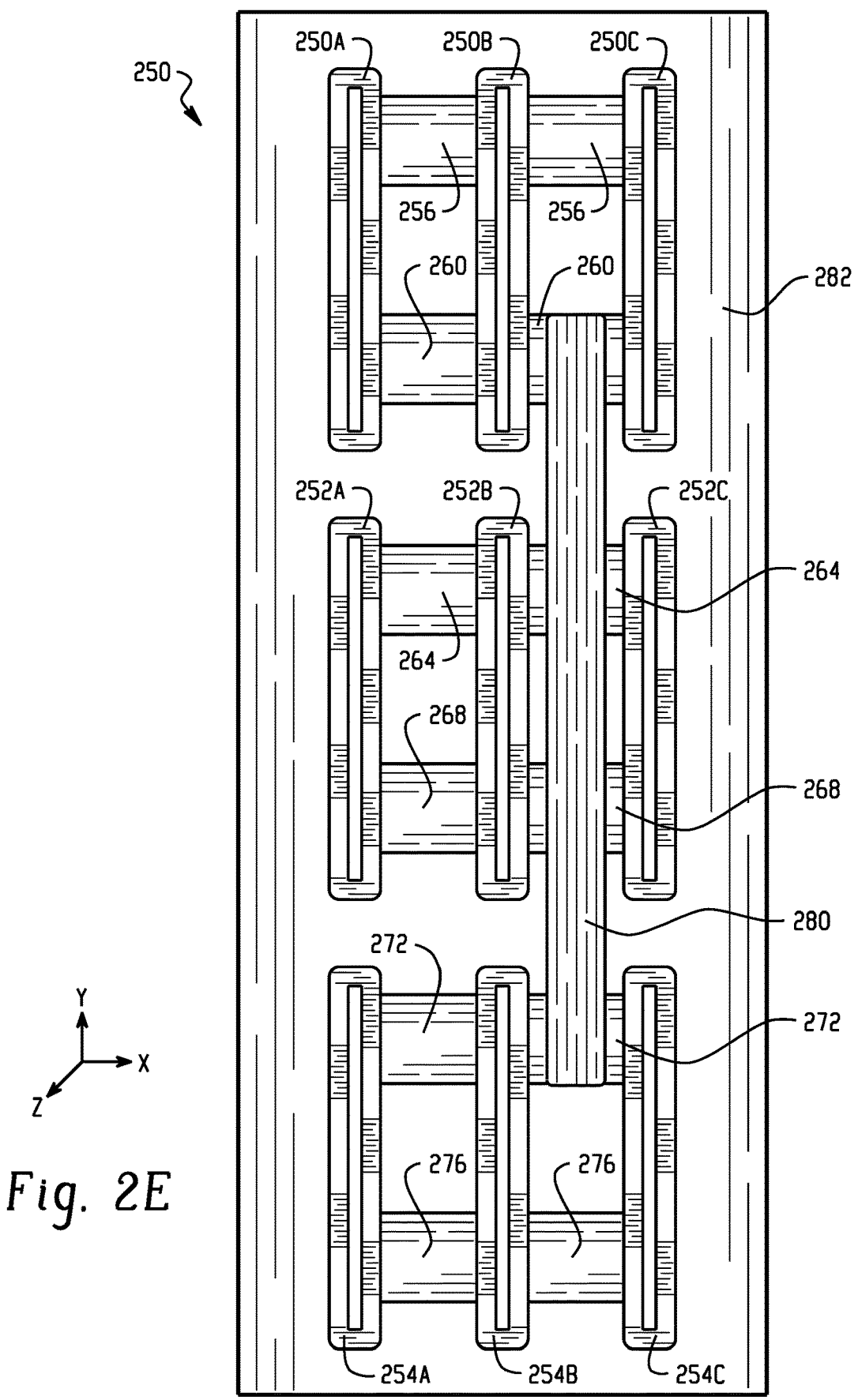

In some embodiments, the structures of FIGS. 2A-2C form a cell 202 (e.g., a standard cell), as shown in FIG. 2C. Thus, in FIG. 2C, the conductive structure 216 provides an intra-cell connection in providing the electrical connection between the first and second active semiconductor regions 208, 212. FIGS. 2D and 2E illustrate the use of other conductive structures for forming intra-cell connections. FIG. 2D depicts a cell 220 including active semiconductor regions 226, 230, 234, 238 formed in a layer 244. In embodiments, the active semiconductor regions 226, 230, 234, 238 are similar to or the same the active semiconductor regions 102, 120 of FIGS. 1A-1G. In embodiments, the layer 244 comprises a substrate or a portion thereof. Gates 222A, 222B, 222C, 224A, 224B, 224C are formed over the layer 244 as shown in the figure. A conductive structure 242 similar to the conductive structure 108 described above with reference to FIGS. 1A-1G forms an electrical connection between the active semiconductor regions 230, 234, 238. The cell 220 of FIG. 2D may be referred to as a "double-height" cell, in contrast to the "single-height" cell 202 depicted in FIG. 2C.

FIG. 2E depicts a cell 250 including active semiconductor regions 256, 260, 264, 268, 272, 276 formed in a layer 282. In embodiments, the active semiconductor regions 256, 260, 264, 268, 272, 276 are similar to or the same the active semiconductor regions 102, 120 of FIGS. 1A-1G. Gates 250A, 250B, 250C, 252A, 252B, 252C, 254A, 254B, 254C are formed over the layer 282 as shown in the figure. A conductive structure 280 similar to the conductive structure 108 described above with reference to FIGS. 1A-1G forms an electrical connection between the active semiconductor regions 260, 264, 268, 272. The cell 250 of FIG. 2E may be referred to as a "triple-height" cell. Although single-height, double-height, and triple-height cells are illustrated in the figures and described herein, it is noted that the conductive structures of the present disclosure (e.g., conductive structures similar to the conductive structure 108 of FIGS. 1A-1G, etc.) can be used to form electrical connections in cells of various other heights (e.g., quadruple-height cells, etc.).

Figure 3A:
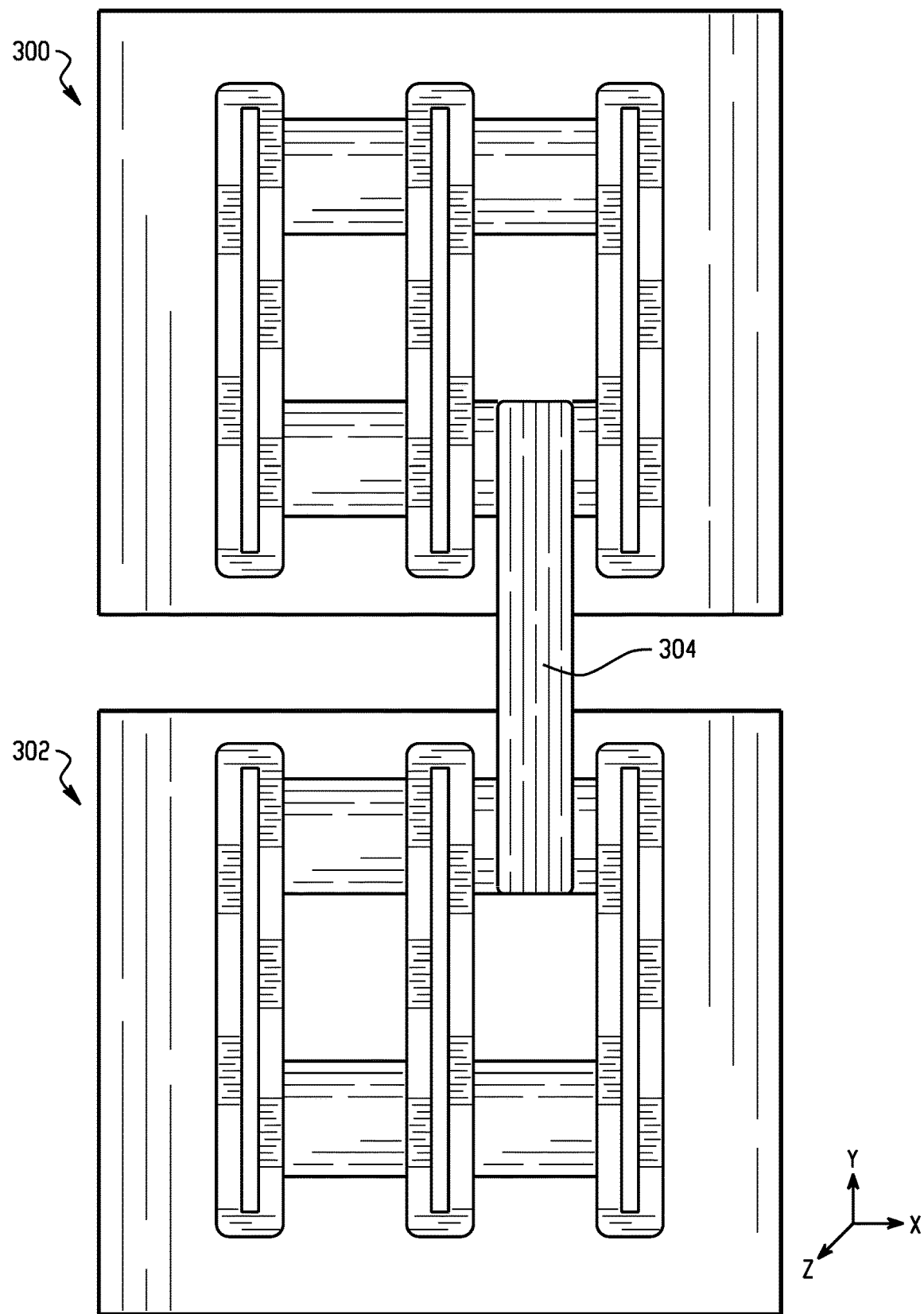
FIGS. 3A and 3B illustrate conductive structures used in forming electrical connections between standard cells, in accordance with some embodiments.

In the embodiments of FIGS. 2C-2E, a conductive structure electrically connects active semiconductor regions of a single cell and thus provides an intra-cell connection, as noted above. By contrast, in the embodiments of FIGS. 3A and 3B, similar conductive structures are used to electrically connect active semiconductor regions of multiple different cells and thus provide inter-cell connections. FIG. 3A depicts cells 300, 302, each of which is the same as or similar to the cell of FIG. 2B. A conductive structure 304 forms an electrical connection between active semiconductor regions of the respective cells 300, 302. The conductive structure 304 is the same as or similar to the conductive structure 108 described above with reference to FIGS. 1A-1G.

Figure 3B:
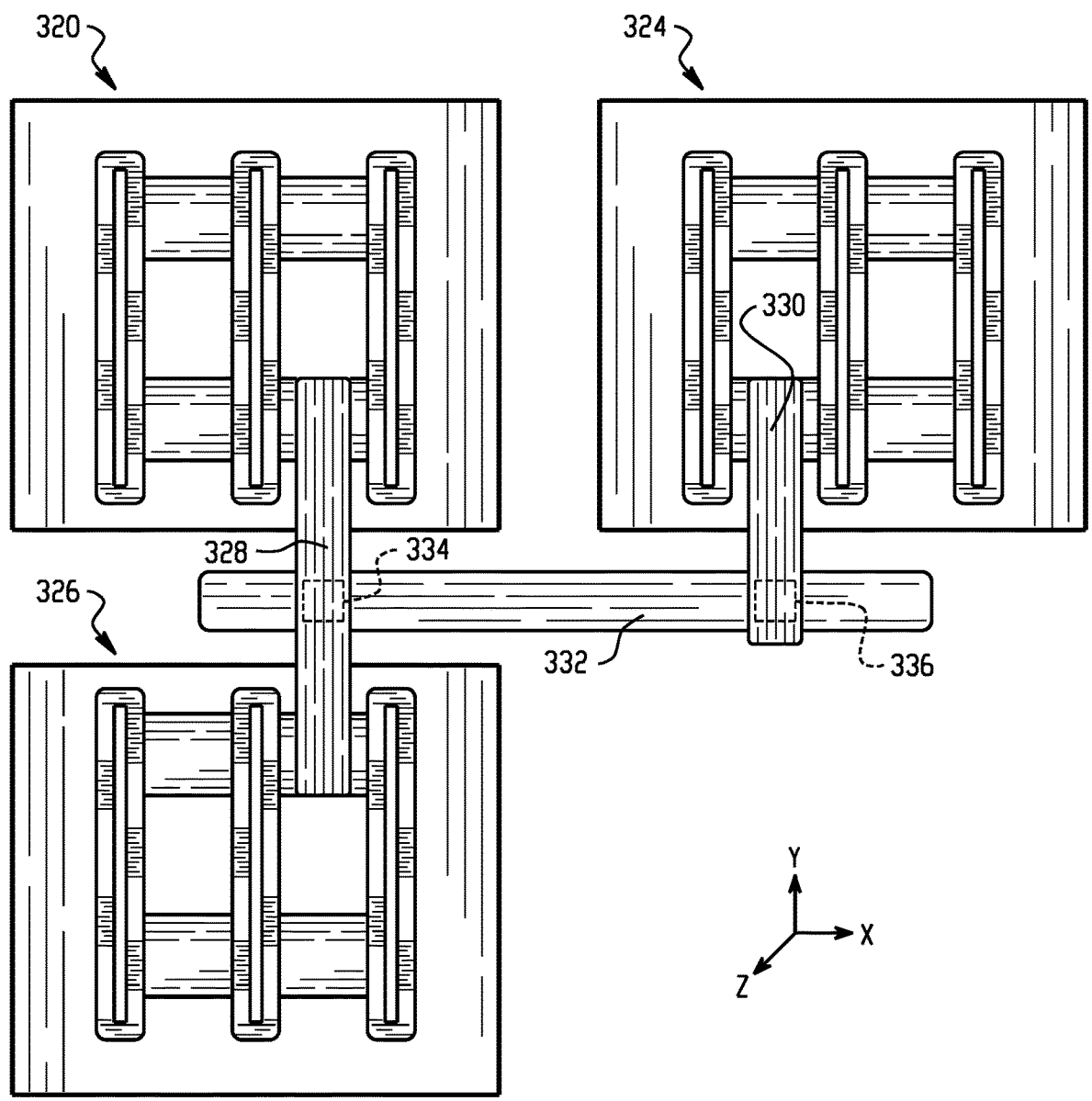

FIG. 3B depicts cells 320, 324, 326, each of which is the same as or similar to the cell of FIG. 2B. A conductive structure 328 forms an electrical connection between active semiconductor regions of the respective cells 320, 326. A conductive structure 330 is electrically coupled to an active semiconductor region of the cell 324. The conductive structures 328, 330 are the same as or similar to the conductive structure 108 described above with reference to FIGS. 1A-1G. In some embodiments, the conductive structures 328, 330 are formed within a metal "MD" layer that is disposed in the second vertical level 110 depicted in FIG. 1B. Further, in the embodiment of FIG. 3B, a conductive structure 332 is formed within a M0 layer that is disposed in the fourth vertical level 118 depicted in FIG. 1B. Vias 334, 336 formed in the third vertical level 114 depicted in FIG. 1B electrically connect the conductive structure 332 to the conductive structures 328, 330, respectively. With these connections, an active semiconductor region of the cell 324 is electrically coupled to active semiconductor regions of the respective cells 320, 326, as shown in the figure.

As noted above, under certain process technologies, each of the MD and M0 layers can include metal lines extending in one direction. Further, under certain process technologies, the direction of metal lines formed in the MD layer is perpendicular to the direction of metal lines formed in the M0 layer. Thus, in the embodiment of FIG. 3B, both the conductive structure 332 extending in the x-direction (e.g., the M0 metal line) and the conductive structures 328, 330 extending in the y-direction (e.g., the MD metal lines) are used in electrically coupling the cell 324 to the other cells 320, 326.

Figure 4:
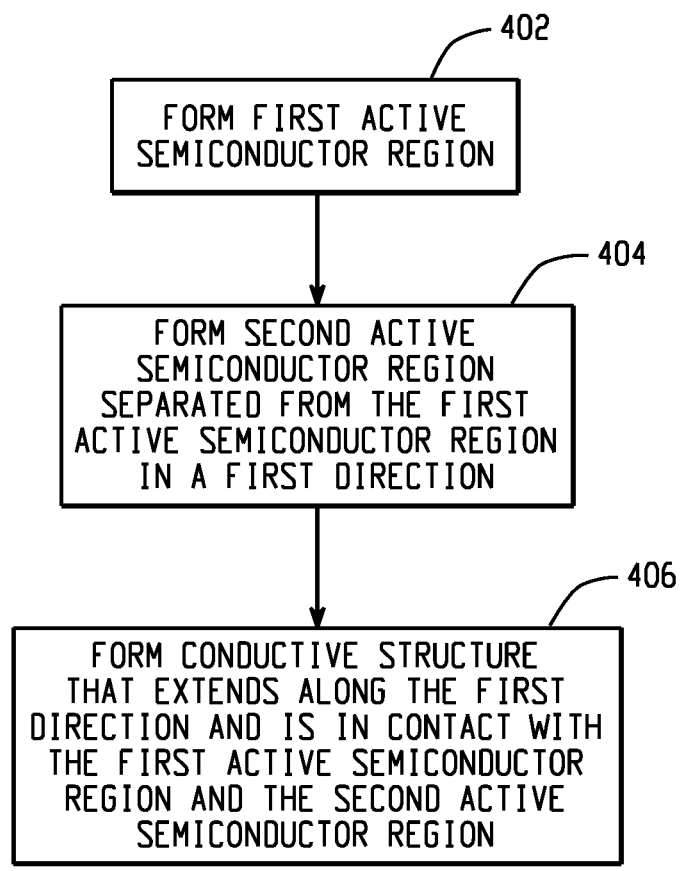
FIG. 4 is a flowchart depicting operations of an example method for forming a semiconductor structure, in accordance with some embodiments.

FIG. 4 is a flowchart depicting operations of an example method for forming a semiconductor structure, in accordance with some embodiments. FIG. 4 is described with reference to FIGS. 1A and 1B above for ease of understanding. But the process of FIG. 4 is applicable to other structures as well. At 402, a first active semiconductor region (e.g., active semiconductor region 102) is formed in a first vertical level (e.g., vertical level 104) of a semiconductor structure. At 404, a second active semiconductor region (e.g., active semiconductor region 120) is formed in the first vertical level. The second active semiconductor region is separated from the first active semiconductor region by a distance in a first direction (e.g., a distance 109 in the y-direction in FIGS. 1A and 1B). At 406, a first conductive structure (e.g., conductive structure 108) is formed in a second vertical level (e.g., vertical level 110) that is adjacent to the first vertical level. The first conductive structure extends along the first direction and is in contact with the first active semiconductor region and the second active semiconductor region. It is noted that in embodiments, some of the operations 402-406 of FIG. 4 are performed simultaneously and not necessarily sequentially, and that in embodiments, the ordering of the operations 402-406 varies from that depicted in the figure.

The present disclosure in various embodiments is directed to semiconductor structures and methods for forming a semiconductor structure. An example semiconductor structure includes a first active semiconductor region disposed in a first vertical level of the semiconductor structure. The semiconductor structure also includes a second active semiconductor region disposed in the first vertical level, where the second active semiconductor region is separated from the first active semiconductor region by a distance in a first direction. The semiconductor structure further includes a first conductive structure disposed in a second vertical level that is adjacent to the first vertical level. The first conductive structure extends along the first direction and electrically couples the first active semiconductor region to the second active semiconductor region.

In an example method of forming a semiconductor structure, a first active semiconductor region is formed in a first vertical level of a semiconductor structure. A second active semiconductor region is formed in the first vertical level. The second active semiconductor region is separated from the first active semiconductor region by a distance in a first direction. A first conductive structure is formed in a second vertical level that is adjacent to the first vertical level. The first conductive structure extends along the first direction and is in contact with the first active semiconductor region and the second active semiconductor region.

An example semiconductor structure includes a first active semiconductor region disposed in a substrate. The semiconductor also includes a second active semiconductor region disposed in the substrate, where the second active semiconductor region is separated from the first active semiconductor region by a distance in a direction. The semiconductor structure also includes a conductive structure extending along the direction and electrically coupling the first active semiconductor region to the second active semiconductor region. The conductive structure is in contact with the first active semiconductor region and the second active semiconductor region.

According to some embodiments, a method for forming a semiconductor structure is disclosed. The method includes the steps of: forming a substrate; forming a first active semiconductor region disposed in a first vertical level of the semiconductor structure in the substrate; forming a second active semiconductor region disposed in the first vertical level in the substrate, the second active semiconductor region being separated from the first active semiconductor region by a distance in a first direction; forming a gate over the substrate; forming a first conductive structure disposed entirely in a second vertical level that is adjacent to the first vertical level, the second vertical level is a single layer of the semiconductor structure, the first conductive structure extending along the first direction and electrically coupling the first active semiconductor region to the second active semiconductor region; forming a first source region and a first drain region of a first transistor formed in the first active semiconductor region on opposite sides of the gate; and forming a second source region and a second drain region of a second transistor formed in the second active semiconductor region on opposite sides of the gate, the first conductive structure electrically couples the first source region or the first drain region of the first transistor to the second source region or the second drain region of the second transistor. According to some embodiments, the first conductive structure is in contact with the first active semiconductor region and the second active semiconductor region. According to some embodiments, the second vertical level is above the first vertical level. According to some embodiments, the first and second active semiconductor regions are parallel active semiconductor regions that extend in a second direction that is perpendicular to the first direction. According to some embodiments, forming a first via in contact with a first portion of the first conductive structure that is disposed above the first active semiconductor region, the first via being disposed in a third vertical level that is above the second vertical level; and forming a second conductive structure in contact with the first via, the second conductive structure being disposed in a fourth vertical level that is above the third vertical level. According to some embodiments, the method further includes: forming a second via in contact with a second portion of the first conductive structure that is disposed above the second active semiconductor region, the second via being disposed in the third vertical level; and forming a third conductive structure in contact with the second via, the third conductive structure being disposed in the fourth vertical level. According to some embodiments, the first conductive structure has a length that is greater than or equal to the distance. According to some embodiments, the first conductive structure comprises a metal line. According to some embodiments, the gate is a single piece.

According to some embodiments, a method for forming a semiconductor structure is disclosed. The method includes the steps of: forming a first active semiconductor region disposed in a substrate; forming a second active semiconductor region disposed in the substrate, the second active semiconductor region being separated from the first active semiconductor region by a distance in a first direction; forming a gate formed over the substrate; forming a conductive structure extending along the first direction and electrically coupling the first active semiconductor region to the second active semiconductor region, the conductive structure being in direct contact with the first active semiconductor region and the second active semiconductor region, the conductive structure is disposed entirely in a single layer of the semiconductor structure; forming a first source region and a first drain region of a first transistor formed in the first active semiconductor region on opposite sides of the gate; and forming a second source region and a second drain region of a second transistor formed in the second active semiconductor region on opposite sides of the gate, the first conductive structure electrically couples the first source region or the first drain region of the first transistor to the second source region or the second drain region of the second transistor. According to some embodiments, the first and second active semiconductor regions are parallel active semiconductor regions that extend in a second direction that is perpendicular to the first direction. According to some embodiments, the gate is a single piece. According to some embodiments, a method for forming a semiconductor structure is disclosed. The method includes the steps of: forming a first active semiconductor region disposed in a first vertical level in a substrate of a semiconductor structure; forming a second active semiconductor region disposed in the first vertical level in the substrate, the second active semiconductor region being separated from the first active semiconductor region by a distance in a first direction; forming a gate disposed over the substrate; forming a first conductive structure disposed entirely in a second vertical level that is adjacent to the first vertical level, the first conductive structure extending along the first direction and being in contact with the first active semiconductor region and the second active semiconductor region, the second vertical level is a single layer of the semiconductor structure; forming a first source region and a first drain region of a first transistor disposed in the first active semiconductor region on opposite sides of the gate; and forming a second source region and a second drain region of a second transistor disposed in the second active semiconductor region on opposite sides of the gate, the first conductive structure electrically couples the first source region or the first drain region of the first transistor to the second source region or the second drain region of the second transistor. According to some embodiments, the first conductive structure electrically couples the first active semiconductor region to the second active semiconductor region. According to some embodiments, the second vertical level is above the first vertical level relative to a substrate. According to some embodiments, the method further includes: forming a first via in contact with a first portion of the first conductive structure that is disposed above the first active semiconductor region, the first via being disposed in a third vertical level that is above the second vertical level; and forming a second conductive structure in contact with the first via, the second conductive structure being disposed in a fourth vertical level that is above the third vertical level. According to some embodiments, the method further includes: forming a second via in contact with a second portion of the first conductive structure that is disposed above the second active semiconductor region, the second via being disposed in the third vertical level; and forming a third conductive structure in contact with the second via, the third conductive structure being disposed in the fourth vertical level. According to some embodiments, the first and second active semiconductor regions are parallel active semiconductor regions that extend in a second direction that is perpendicular to the first direction. According to some embodiments, the first conductive structure comprises a metal line. According to some embodiments, the gate is a single piece.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method for forming a semiconductor structure, the method comprising:
   forming a first active semiconductor region disposed in a first vertical level of the semiconductor structure in a substrate;
   forming a second active semiconductor region disposed in the first vertical level in the substrate, wherein the second active semiconductor region being separated from the first active semiconductor region in a first direction;
   forming a first conductive structure disposed in a second vertical level that is adjacent to the first vertical level, wherein the second vertical level is a single layer of the semiconductor structure, the first conductive structure extending along the first direction as a single piece formed on a first source/drain region of a first transistor and a second source/drain region of a second transistor and electrically coupling the first source/drain region to the second source/drain region;
   forming the first source/drain region in the first active semiconductor region on a side of a gate over the substrate; and
   forming the second source/drain region in the second active semiconductor region on the side of the gate.

2. The method of claim 1, wherein the first conductive structure is in contact with the first source/drain region and the second source/drain region.

3. The method of claim 1, wherein the second vertical level is above the first vertical level.

4. The method of claim 1, wherein the first and second active semiconductor regions are parallel active semiconductor regions that extend in a second direction that is perpendicular to the first direction.

5. The method of claim 1, further comprising:
   forming a first via in contact with a first portion of the first conductive structure that is disposed above the first active semiconductor region, the first via being disposed in a third vertical level that is above the second vertical level; and
   forming a second conductive structure in contact with the first via, the second conductive structure being disposed in a fourth vertical level that is above the third vertical level.

6. The method of claim 5, further comprising:
   forming a second via in contact with a second portion of the first conductive structure that is disposed above the second active semiconductor region, the second via being disposed in the third vertical level; and
   forming a third conductive structure in contact with the second via, the third conductive structure being disposed in the fourth vertical level.

7. The method of claim 1, wherein the second active semiconductor region is separated from the first semiconductor region by a distance and the first conductive structure has a length that is greater than or equal to the distance.

8. The method of claim 1, wherein the first conductive structure comprises a metal line.

9. The method of claim 1, wherein the gate is a single piece.

10. A method for forming a semiconductor structure, the method comprising:
    forming a first active semiconductor region disposed in a substrate;
    forming a second active semiconductor region disposed in the substrate, wherein the second active semiconductor region being separated from the first active semiconductor region in a first direction;
    forming a conductive structure extending along the first direction as a single piece on a first source/drain region of a first transistor and a second source/drain region of a second transistor and electrically coupling the first source/drain region to the second source/drain region, wherein the conductive structure being in direct contact with the first source/drain region and the second source/drain region, wherein the conductive structure is disposed in a single layer of the semiconductor structure;
    forming the first source/drain region in the first active semiconductor region on a side of a gate; and
    forming the second source/drain region in the second active semiconductor region on the side of the gate.

11. The method of claim 10, wherein the first and second active semiconductor regions are parallel active semiconductor regions that extend in a second direction that is perpendicular to the first direction.

12. The method of claim 10, wherein the gate is a single piece.

13. A method for forming a semiconductor structure, the method comprising:
   forming a first active semiconductor region disposed in a first vertical level in a substrate of a semiconductor structure;
   forming a second active semiconductor region disposed in the first vertical level in the substrate, wherein the second active semiconductor region being separated from the first active semiconductor region in a first direction;
   forming a first conductive structure disposed in a second vertical level that is adjacent to the first vertical level, the first conductive structure extending along the first direction as a single piece formed on and being in contact with a first source/drain region of a first transistor and a second source/drain region of a second transistor, wherein the second vertical level is a single layer of the semiconductor structure;
   forming the first source/drain region in the first active semiconductor region on a side of a gate; and
   forming the second source/drain region in the second active semiconductor region on the side of the gate.

14. The method of claim 13, wherein the first conductive structure electrically couples the first source/drain region to the second source/drain region.

15. The method of claim 13, wherein the second vertical level is above the first vertical level relative to a substrate.

16. The method of claim 13, further comprising:
   forming a first via in contact with a first portion of the first conductive structure that is disposed above the first active semiconductor region, the first via being disposed in a third vertical level that is above the second vertical level; and
   forming a second conductive structure in contact with the first via, the second conductive structure being disposed in a fourth vertical level that is above the third vertical level.

17. The method of claim 13, further comprising:
   forming a second via in contact with a second portion of the first conductive structure that is disposed above the second active semiconductor region, the second via being disposed in the third vertical level; and
   forming a third conductive structure in contact with the second via, the third conductive structure being disposed in the fourth vertical level.

18. The method of claim 13, wherein the first and second active semiconductor regions are parallel active semiconductor regions that extend in a second direction that is perpendicular to the first direction.

19. The method of claim 13, wherein the first conductive structure comprises a metal line.

20. The method of claim 13, wherein the gate is a single piece.

* * * * *